(12) United States Patent
Allman et al.

(10) Patent No.: US 6,678,950 B1
(45) Date of Patent: Jan. 20, 2004

(54) METHOD FOR FORMING A BONDING PAD ON A SUBSTRATE

(75) Inventors: Derryl D. J. Allman, Camas, WA (US); David T. Price, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 28 days.

(21) Appl. No.: 10/007,247

(22) Filed: Nov. 1, 2001

(51) Int. Cl.[7] .................................................. H05K 3/10
(52) U.S. Cl. .......................................... 29/846; 438/612
(58) Field of Search .................... 29/846, 874; 438/612, 438/106, 613, 666; 257/E21.808, 750, 758, 781

(56) References Cited

U.S. PATENT DOCUMENTS 5,834,365 A * 11/1998 Ming-Tsung et al. ....... 438/612
6,069,066 A * 5/2000 Huang et al. ................ 438/612
6,306,749 B1 * 10/2001 Lin ............................. 438/612

* cited by examiner

Primary Examiner—Carl J. Arbes
Assistant Examiner—T. D. Pham
(74) Attorney, Agent, or Firm—Luedeka, Neely & Graham, PC

(57) ABSTRACT

A bonding pad for an integrated circuit, having a conductive base layer. The conductive base layer has slots formed in it, where the slots extend completely through the conductive base layer. An insulating layer is disposed on top of the conductive base layer. The insulating layer protrudes into the slots of the conductive base layer. The insulating layer also includes a low k material. A conductive top layer is disposed on top of the insulating layer.

8 Claims, 1 Drawing Sheet

METHOD FOR FORMING A BONDING PAD ON A SUBSTRATE

FIELD

This invention relates to the field of integrated circuit manufacturing. More particularly, the invention relates to the design and manufacture of bonding pads for an integrated circuit.

BACKGROUND

As the industry continues to advance, integrated circuits continue to become more complex, incorporate more components, operate at higher speeds, and are contained within a smaller area on the substrate. Consequently, it becomes increasingly important to effectively isolate components one from another so as to reduce undesired phenomena, such as interconnect capacitance, which impede the performance of the integrated circuit.

With respect to the design and manufacture of bonding pads, layers of low k materials, which have relatively low dielectric constants in comparison to other nonconductive materials used in the integrated circuit, are effective in isolating adjacent conductors and reducing capacitance.

Unfortunately, however, the incorporation of low k dielectrics into bonding pads has proved to be problematic in other aspects. Low k materials are typically significantly softer and weaker than higher k materials, and when force is applied to the bonding pad, such as during probing or bonding, the layers of low k material tend to crack and fracture. These fractures tend to propagate through the dielectric layers and may even result in delamination of the dielectric layer or the entire bonding pad.

What is needed, therefore, is a bonding pad that provides both the isolation benefits of low k dielectric materials and sufficient strength to resist cracking and fracturing.

SUMMARY

The above and other needs are met by a bonding pad for an integrated circuit, having a conductive base layer. The conductive base layer has slots formed in it, where the slots extend completely through the conductive base layer. An insulating layer is disposed on top of the conductive base layer. The insulating layer protrudes into the slots of the conductive base layer. The insulating layer also includes a low k material. A conductive top layer is disposed on top of the insulating layer.

The bonding pad as described above allows the incorporation of the low k material between layers of the bonding pad while minimizing the inherent softness of the low k layer. When the low k insulating layer is formed, most of the low k material is disposed in the slots of the conductive base layer. These slots also tend to reduce the amount of low k material that tends to build up in the center of a large area that is covered with low k material. Thus, the slots not only contain most of the low k material, but prevent additional build up of low k material in the center of the conductive base layer. In this manner, there is a reduced thickness of low k material between the conductive base layer and the conductive top layer of the bonding pad, which tends to strengthen the overall structure of the bonding pad. However, the benefits of the use of the low k material between the conductive base layer and the conductive top layer of the bonding pad are retained.

In various preferred embodiments the bonding pad includes a plurality of vias extending through the insulating layer and electrically connecting the conductive base layer to the conductive top layer at peripheral portions of the conductive base layer and the conductive top layer. The insulating layer preferably includes a base oxide layer on top of the conductive base layer, a low k dielectric layer on top of the base oxide layer, and a cap oxide layer between the low k dielectric layer and the conductive top layer.

Both the conductive base layer and the conductive top layer preferably include a metal such as aluminum, copper, nickel, ruthenium, titanium, tungsten, platinum, and gold. The slots of the conductive base layer preferably form a pattern of substantially parallel slots, having a width of about eleven microns and a spacing of about three microns. The slot width and number of slots preferably depend at least in part on the thickness and the size of the bonding pad. The insulating layer preferably has a thickness, as measured between the conductive base layer and the conductive top layer, of from about five thousand angstroms to about fifteen thousand angstroms.

According to another aspect of the invention, there is provided an integrated circuit having the bonding pad of claim 1. A method of forming the bonding pad is also described herein.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
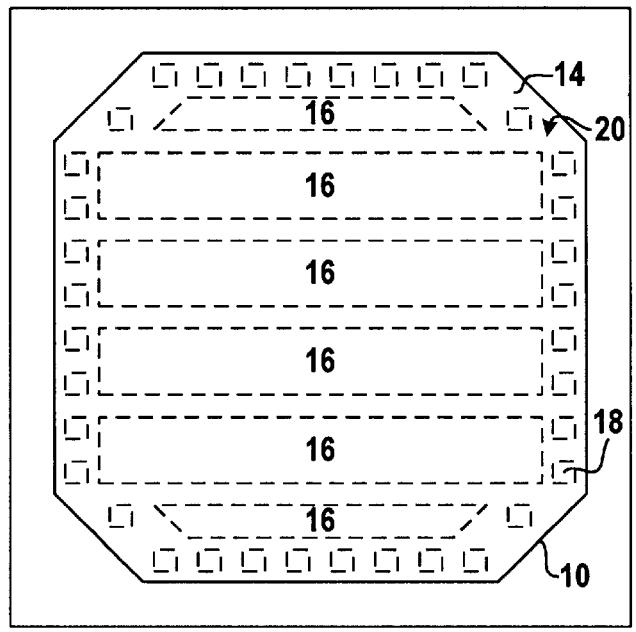
FIG. 1 is a top plan view of a conductive base layer of a bonding pad according to a first embodiment of the present invention.

Referring now to FIG. 1, there is depicted a top plan view of a bonding pad 10 according to a preferred embodiment of the invention. The bonding pad 10 is formed as part of an integrated circuit 12. As depicted in FIG. 1, the bonding pad 10 comprises most of the integrated circuit 10. However, this depiction is representational only. In actual embodiments, the bonding pad 10 is fairly small in comparison to the balance of the integrated circuit 12. Further, in actual embodiments there are preferably many bonding pads 10 formed in the integrated circuit 12. Further, the active and other circuit elements of the integrated circuit 12 have been omitted from FIG. 1, so as to not unduly distract from the depiction of the bonding pad 10. Thus, the depiction of FIG. 1 is intended to highlight the more relevant portions of the integrated circuit 12 in light of the present invention, to facilitate the description and understanding of the invention.

Figure 2:
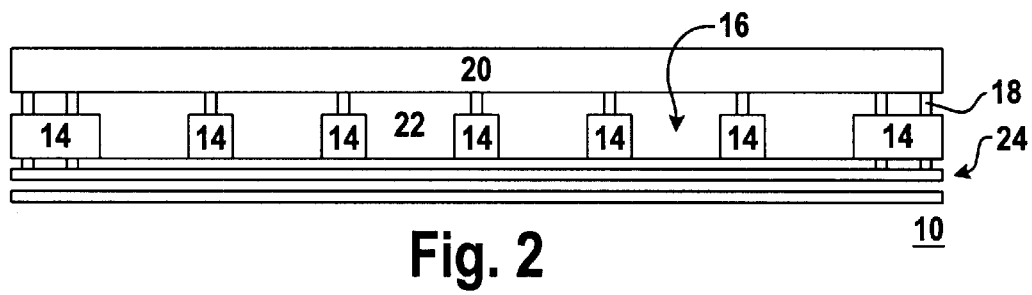
FIG. 2 is a cross sectional view of a portion of the bonding pad structure to the first embodiment of the present invention.

As best seen in FIG. 2, the bonding pad 10 is formed in part of a conductive base layer 14 and a conductive top layer 20. Between the conductive base layer 14 and the conductive top layer 20 is an insulating layer 22. The conductive base layer 14 has slots 16 formed in it, which slots 16 preferably extend completely through the conductive base layer 14. Electrically conductive vias 18 electrically connect the conductive base layer 14 to the conductive top layer 20. The electrically conductive vias 18 also preferably electrically connect the conductive base layer 14 and the conductive top layer 20 to lower layers 24, some of which are electrically conductive, and some of which are electrically insulating. It is appreciated that there may be a greater or lesser number of lower layers 24 than depicted in FIG. 2, and the structure as depicted in FIG. 2 is in this regard representational only. It is also appreciated that the embodiments as described below can be applied to one or more of the lower levels 24.

The conductive base layer 14 and the conductive top layer 20 are preferably formed of a metal such as aluminum, tantalum, gold, copper, platinum, ruthenium, or titanium. It is appreciated that the recitation of such metals as used herein includes various alloys and nitrides of the metals, as applicable to the specific structure being described. It is also appreciated that such layers are often formed in multiple layers, which include adhesion, anti-reflection, and diffusion barrier layers of different materials, and which are formed to act cooperatively with the conduction layer that is also formed. Thus, the recitation of a specific material herein is intended to be representative and not exclusive of the various materials that can be used to form the structure.

The conductive base layer 14 is preferably formed as a contiguous layer, after which the slots 16 are etched through the conductive base layer 14 in a wet or dry etch procedure. Alternately, the conductive base layer 14 is originally formed with the slots 16, such as with a lift off deposition process. The conductive base layer 14 is preferably between about three thousand angstroms and about twenty thousand angstroms in thickness, and most preferably about ten thousand angstroms thick. The slots 16 formed in the conductive base layer 14 are preferably between about five microns and about twenty microns in width, and are most preferably about eleven microns in width. The bars of the conductive base layer 14 that are left between the slots 16 are preferably about one micron to about ten microns in width, and most preferably about three microns in width.

The dimensions and shape of the bonding pad do not necessarily constitute a square feature, but can take on other shapes, such as a rectangle or a circle. The bonding pad 10 is preferably between about fifty microns and about one hundred and fifty microns square, and most preferably about eighty-five microns square. The slots 16 preferably have a length of between about twenty-five microns and about one hundred and thirty-five microns, and most preferably about sixty-nine microns. It is appreciated that the preferred dimensions as given above are representational, and highly dependent upon the technology to which the present invention is applied.

Figure 3:
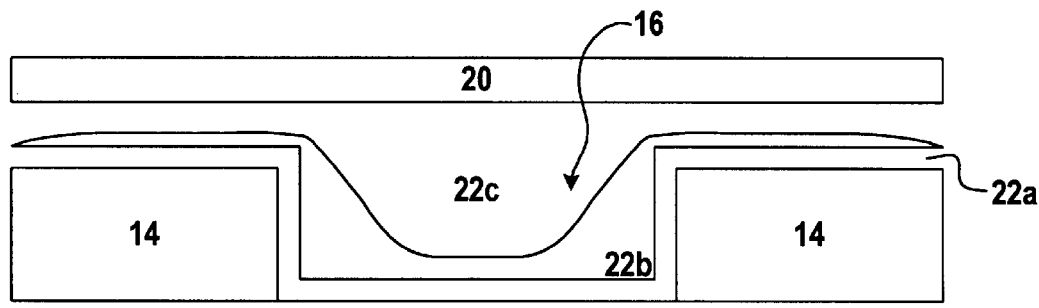
FIG. 3 is a detailed cross sectional view of a portion of the bonding pad, showing a composite dielectric layer according to a preferred embodiment of the invention.

FIG. 3 depicts a portion of the bonding 10 in greater detail. Depicted are two of the bars of the conductive bottom layer 14 in cross section, and detail of a preferred embodiment of the insulating layer 22 that is formed between the conductive bottom layer 14 and the conductive top layer 20, especially in the region of the slot 16 between the two bars of the conductive bottom layer 14. In various preferred embodiments, the insulating layer 22 includes layers of electrically insulating materials such as oxides like silicon dioxide, nitrides like silicon nitride, and most preferably a variety of materials that tend to exhibit dielectric constants that are lower then those typically associated with silicon dioxide, which materials are generally referred to as low k materials.

In a most preferred embodiment, the insulating layer 22 is formed with a base oxide layer 22a on top of the conductive base layer 14. The base oxide layer 22a preferably has a thickness of between about twenty-five angstroms and about three thousand angstroms, and most preferably about five hundred angstroms. The base oxide layer 22a is most preferably a relative hard material, such as silicon dioxide. The base oxide layer 22a may be formed according to a variety of processes, such as sputter deposition or chemical vapor deposition, and is most preferably a relatively conformal layer, indicating that it has a fairly uniform thickness.

A low k dielectric layer 22b is preferably formed on top of the base oxide layer 22a. As depicted in FIG. 3, the low k dielectric layer 22b preferably fills in most of the slot 16 between the bars of the conductive base layer 14. Thus, the thickness of the low k dielectric layer 22b in the slot 16 is preferably between about two thousand angstroms and about twelve thousand angstroms, and most preferably about six thousand angstroms, and the thickness of the low k dielectric layer 22b above the bars of the conductive base layer 24 is preferably between about zero angstroms and about twelve thousand angstroms, and most preferably about five hundred angstroms. Thus, the thickness of the low k dielectric layer 22b is most preferably not uniform.

The planarity of the low k dielectric layer 22b may be formed in a variety of different processes. For example, in one embodiment the low k dielectric layer 22b is a material such as a polyamide that is formed by spinning the material onto the substrate. In other embodiments the low k dielectric layer 22b can be deposited using chemical vapor deposition. Other processes that are compatible with the specific materials used for the various layers may also be employed.

The low k dielectric layer 22b tends to be relatively soft, and the slots 16 limit the build up of the low k dielectric layer 22b between the bars of the conductive base layer 14. The low k film 22b above the bars of the conductive base layer 14 is significantly less thick than the harder silicon dioxide layer 22c, thus provide structural support to the conductive top layer 20, which tends to reduce the occurrence and degree of cracking and other stress failures of the bonding pad 10 during probing and bonding.

The low k dielectric layer 22b is preferably overlaid with a cap oxide layer 22c. After planarization the cap oxide layer 22c preferably has a thickness above layer 14 of between about three thousand angstroms and about fifteen thousand angstroms, and most preferably about nine thousand angstroms. The cap oxide layer 22c is most preferably a relative hard material, such as silicon dioxide. The cap oxide layer 22c may be formed according to a variety of processes, such as sputter deposition or chemical vapor deposition, and is most preferably a relatively conformal layer, indicating that it has a fairly uniform thickness as deposited above the low k film 22b.

Thus, in the embodiment depicted in FIG. 3, the greater portion of the thickness of the insulating layer 22 between the bars of the conductive bottom layer 14 and the conductive top layer 20 is the relatively harder bottom oxide layer 22a and cap oxide layer 22c. This tends to provide structural support to the conductive top layer 20, as described above. The thickness of the insulating layer 20 between the top of the bars of the conductive base layer 14 and the conductive top layer 20 is preferably between about three thousand angstroms and about fifteen thousand angstroms, and most preferably about ten thousand angstroms.

However, the greater portion of the thickness of the insulating layer 22 in the slots 16 of the conductive bottom layer 14 beneath the conductive top layer 20 is the cap oxide layer 22c. This tends to increase the hardness and strength of the film below the bonding pad 20. If a crack is initiated during the bonding operation, the propagation of the crack is preferably limited to the segmented area 16. To further strengthen the bonding pad stack, a series of vias can be added to connect metal lines 14 to the bonding pad layer 20. The thickness of the low k dielectric layer 22b in the slots 16 of the conductive base layer 14 is preferably between about three thousand angstroms and about ten thousand angstroms, and most preferably about six thousand angstroms.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for forming a bonding pad on a substrate, the method comprising the steps of:

forming a conductive base layer on the substrate, the conductive base layer having slots extending completely through the conductive base layer, forming an insulating layer on top of the conductive base layer, the insulating layer protruding into the slots of the conductive base layer, and the insulating layer including a low k material, the insulating layer formed by, forming a base oxide layer on top of the conductive base layer, forming a low k dielectric layer on top of the base oxide layer, and forming a cap oxide layer between the low k dielectric layer and the conductive top layer, and forming a conductive top layer on top of the insulating layer.

2. The method of claim 1 further comprising the step of forming a plurality of conductive vias extending through the insulating layer and electrically connecting the conductive base layer to the conductive top layer at peripheral portions and adjacent the slots of the conductive base layer and the conductive top layer.

3. The method of claim 1 wherein both the conductive base layer and the conductive top layer comprise a metal selected from the group consisting of aluminum, copper, nickel, ruthenium, titanium, tungsten, platinum, and gold.

4. The method of claim 1 wherein the slots of the conductive base layer comprise a pattern of substantially parallel slots.

5. The method of claim 1 wherein the slots of the conductive base layer have a width of about eleven microns and a spacing of about three microns.

6. The method of claim 1 wherein the insulating layer has a thickness measured between the conductive base layer and the conductive top layer of from about three thousand angstroms to about fifteen thousand angstroms.

7. The method of claim 1 further comprising forming multiple layers of the conductive base layer and the overlying insulating layer below the conductive top layer.

8. An integrated circuit, the improvement comprising a bonding pad formed according to the method of claim 1.

* * * * *